United States Patent
Lee et al.

(10) Patent No.: US 6,897,116 B2
(45) Date of Patent: May 24, 2005

(54) METHOD AND STRUCTURE TO IMPROVE THE GATE COUPLING RATIO (GCR) FOR MANUFACTURING A FLASH MEMORY DEVICE

(75) Inventors: Wen-Fang Lee, Hsin-Chu (TW);
Wei-Lun Hsu, Hsin-Chu (TW);
Chung-Ping Chao, Taipei (TW);
Yu-Hsien Lin, Kaohsiung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 10/660,606

(22) Filed: Sep. 12, 2003

(65) Prior Publication Data

US 2005/0056879 A1 Mar. 17, 2005

(51) Int. Cl.⁷ .......................................... H01L 21/8247
(52) U.S. Cl. ..................... 438/267; 438/304; 438/596
(58) Field of Search ................................ 438/258, 266, 438/267, 304, 596

(56) References Cited

U.S. PATENT DOCUMENTS

| | | | | |
|---|---|---|---|---|
| 6,171,909 B1 | * | 1/2001 | Ding et al. | 438/596 |
| 6,172,394 B1 | * | 1/2001 | Nakagawa | 438/304 |
| 6,403,421 B1 | * | 6/2002 | Ikeda et al. | 438/267 |
| 6,562,681 B2 | * | 5/2003 | Tuan et al. | 438/267 |

* cited by examiner

Primary Examiner—Chandra Chaudhari
(74) Attorney, Agent, or Firm—Intellectual Property Solutions, Incorporated

(57) ABSTRACT

Method and structure to improve the gate coupling ratio (GCR) for manufacturing a flash memory device are provided. The method and structure include the following steps. A gate oxide layer, a first semiconductor layer, and an insulating layer are formed sequentially over a provided semiconductor substrate. An etching process is used to etch the insulating layer. A semiconductor spacer is then deposited and used as a self-aligned etching mask. After the self-aligned etching, the insulating layer is removed and an insulating stacked structure is deposited. Finally, a second semiconductor layer is deposited and etched to form the control gate region.

17 Claims, 10 Drawing Sheets

METHOD AND STRUCTURE TO IMPROVE THE GATE COUPLING RATIO (GCR) FOR MANUFACTURING A FLASH MEMORY DEVICE

BACKGROUND OF THE INVENTION

1. Field of the Invention

The present invention relates generally to method and structure for manufacturing a flash memory device. The present invention further relates to the method and structure for manufacturing a flash memory device with enhanced gate coupling ratio (GCR) and thereafter a smaller applied control gate voltage needed in the operation of the flash memory device.

2. Description of the Prior Art

Nonvolatile flash memory devices such as erasable programmable read-only memory (EPROM) or electrically erasable programmable read-only memory (EEPROM) or flash memory have been widely used and accepted as data storage devices due to their capabilities to store data after the power is turned off.

Generally, a flash memory device is very similar to a metal oxide semiconductor field effect transistor (MOSFET) except that it has a stacked gate structure. Two gates are provided generally in a stacked manner in a flash memory device, one of which is a floating gate, normally formed by polysilicon for the storage of electrical charges, and the other of which is the control gate to control the access of information. The floating gate is generally located underneath the control gate with a dielectric layer (for example, oxide/nitride/oxide stacked structure) lying between the two gates. The floating gate is named because it is always in the "floating" state without a connection to the exterior circuitry. Instead, the control gate is usually connected to a word line. A gate oxide (sometimes called tunnel oxide) lies between the floating gate and the semiconductor substrate. Additionally, source and drain regions are arranged on the semiconductor substrate on both sides of the gates.

The operation of a flash memory device will be described briefly as follows. During a write operation, a high programming voltage is applied on the control gate, and this forces an inversion region to form in the p-type substrate. The drain voltage is increased to half of the control gate voltage while the source is grounded, and this increases the voltage drop between the drain and the source. In the presence of the inversion region, the current between the drain and the source increases. The resulting high electron flow from the source to the drain increases the kinetic energy of the electrons. This causes electrons to gain enough energy to overcome the silicon/silicon oxide energy barrier and be collected in the floating gate. The floating gate can be erased by grounding the control gate and raising the source voltage to a sufficiently high positive voltage to transfer electrons out of the floating gate to the source gate by tunneling through the thin gate oxide layer.

It is the general trend in the semiconductor market to manufacture devices with miniaturized dimensions, lower operation voltage, lower cost, higher speed, etc. One of the key features of a flash memory device is the gate coupling ratio (GCR) between the floating gate and the control gate, which affects both the operating voltage and device speed. The read/write method of a flash memory is effected by means of electrons transferring between the floating gate and the source/drain gate.

The gate coupling ratio is defined as the ratio of an induced voltage on the floating gate to the incident voltage applied on the control gate. For the perfect coupling, this ratio is equal to 100%. Generally, increasing the gate coupling ratio can lower the operating voltage and increase the device speed at the same time. A few approaches, which have been taken to increase the gate coupling ratio, include: increasing the overlapped area between the floating gate and the control gate; reducing the dielectric thickness between the floating gate and the control gate; and increasing the dielectric constant (k) of the dielectric layer between the floating gate and the control gate.

FIGS. 1A through 1H are schematic cross-sectional views showing the progression of steps for forming a flash memory device according to a prior art. As shown in FIG. 1A, a semiconductor substrate 110 is provided, the semiconductor substrate has a plurality of shallow trench isolation (STI) structures (not shown) therein. A gate oxide layer 111, a first polysilicon (poly 1) layer 112 and a silicon nitride (SiN) layer 113 are sequentially formed over the substrate 110. The poly 1 layer 112 used as floating gate material is usually grown, for example, by chemical vapor deposition. The silicon nitride layer 113, used as an etching mask for the poly 1 layer etching, is usually also grown by chemical vapor deposition.

As shown in FIG. 1B, a photo resist layer 114 is then formed over the top of silicon nitride layer 113 and patterned by a conventional photolithography process. The photo resist layer 114 is used as an etching mask for silicon nitride layer 113 etching.

As shown in FIG. 1C, an etching process is therefore performed on the silicon nitride layer 113. Furthermore, the photo resist is stripped after the etching reaction is completed.

As shown in FIG. 1D, a silicon nitride spacer layer 115 is then deposited onto the surface as well as the side wall of the patterned silicon nitride layer 113. Furthermore, in FIG. 1E, an etching process on the poly 1 layer 112 is performed by using the silicon nitride spacer layer 115 as a self-aligned etching mask. After the self-aligned etching, the silicon nitride layer 113 and the silicon nitride spacer 115 are removed, which is as shown in FIG. 1F.

FIG. 1G shows that an insulating stacked structure 116 is then deposited by using, for example, chemical vapor deposition. The insulating stacked structure is sometimes called inter-poly dielectric because it is used as the dielectric between the floating gate (poly 1) and the control gate (poly 2).

FIG. 1H shows that a second polysilicon (poly 2) layer 117 is then deposited and patterned. The poly 2 layer forms the control gate of the flash memory device. After the poly 2 layer etching, drain and source formation (not shown) is therefore conducted by conventional ion implantation process.

In the prior art, the floating gate surface area is the floating gate periphery length times the floating gate width "Lw". As shown in FIG. 1I, the floating gate is drawn in a three-dimensional illustration in order to clearly show how the floating gate surface area is calculated. The floating gate height 312 is typically of thickness 800 Angstroms (A). The floating gate length 314 is typically 2500 A. The floating gate width 313 herein is designated as "Lw". Therefore, the floating gate surface area that is effectively coupled to the control gate is the sum of area 311, area 315 and area 316. Therefore, Floating gate surface area (for the prior art)=(800+2500+800)×$L_W$=4100$L_W$ In the prior art as described above, the surface area of the floating gate overlapped with that of the control gate is limited, which results in a gate coupling ratio of only 60%. It would therefore be desirable to provide a manufacturing method for a flash memory device with a larger surface area of the floating gate overlapped with that of the control gate so that a higher gate coupling ratio can be obtained.

SUMMARY OF THE INVENTION

In accordance with the present invention, method and structure are provided for forming a flash memory device with a semiconductor spacer that substantially increases the overlapped area between the floating gate and the control gate, which in turn results in a substantially improved gate coupling ratio (GCR).

In one preferred embodiment of the present invention, method and structure to improve the gate coupling ratio (GCR) for fabricating a flash memory device are provided. The method and structure include the following steps. A gate oxide layer, a first semiconductor layer, and an insulating layer are formed sequentially over a provided semiconductor substrate. Then the insulating layer is partially removed until the partial first semiconductor layer is exposed. After that, a semiconductor spacer is formed on both the exposed insulating layer and first semiconductor layer. The semiconductor spacer is partially removed until the insulating layer is exposed. Then the insulating layer is partially removed in order to expose the first semiconductor layer; thus, the semiconductor spacer protrudes through the surface of the first semiconductor layer. Later an insulating stacked structure is formed over the surface of the first semiconductor layer and the semiconductor spacer. Finally a second semiconductor layer is formed over the insulating stacked structure.

Further objectives and advantages of the present invention will become apparent from a careful reading of the detailed description provided herein below with appropriate reference to the accompanying drawings.

BRIEF DESCRIPTION OF THE DRAWINGS

The foregoing aspects and many of the attendant advantages of this invention will become more readily appreciated and be better understood by reference to the following detailed description, when taken in conjunction with the accompanying drawings, wherein.

DESCRIPTION OF THE PREFERRED EMBODIMENTS

Reference will be made in detail to the present preferred embodiments of the invention, examples of which are illustrated in the accompanying drawings.

Figure 1A:
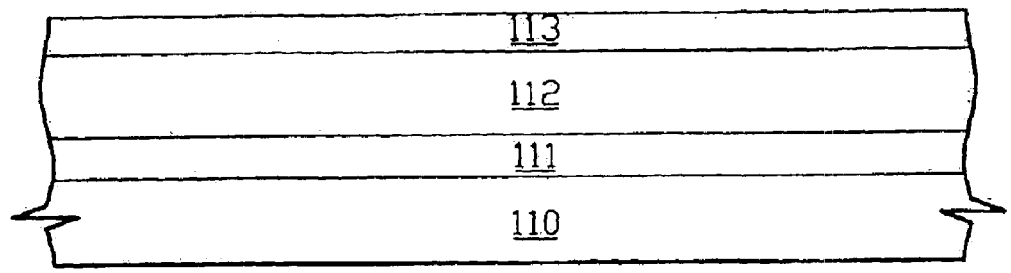
FIGS. 1A through 1H show the schematic cross-sectional views of the progression of steps for forming a flash memory device in the prior art.
Figure 1B:
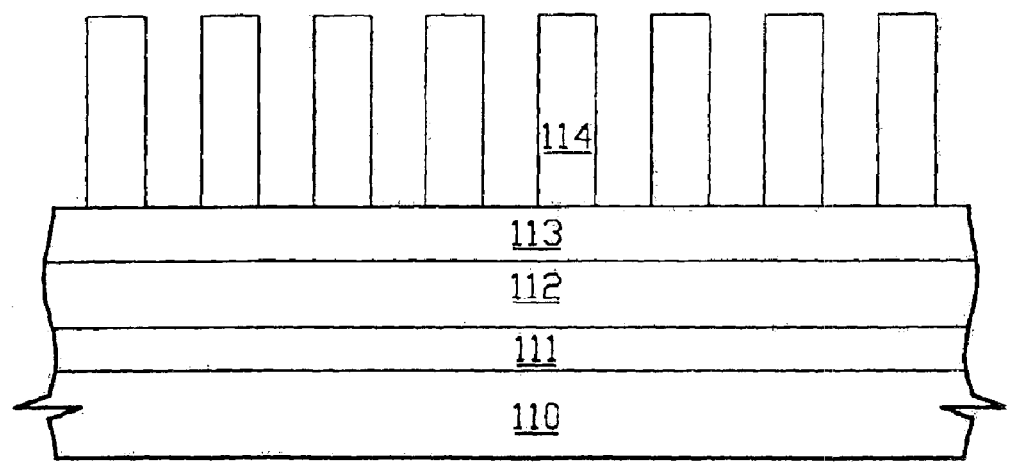
Figure 1C:
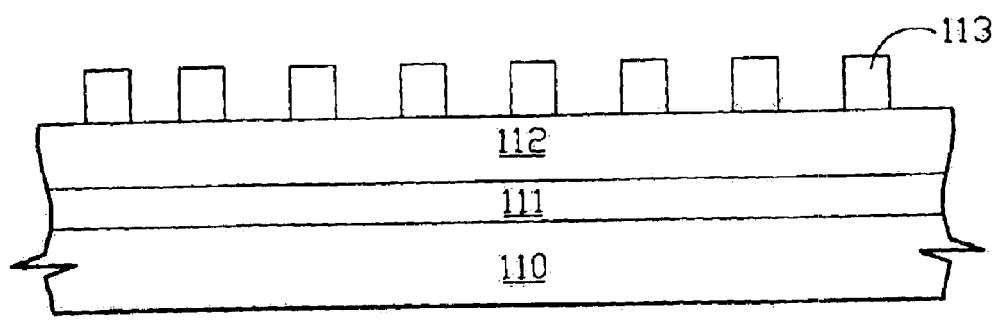
Figure 1D:
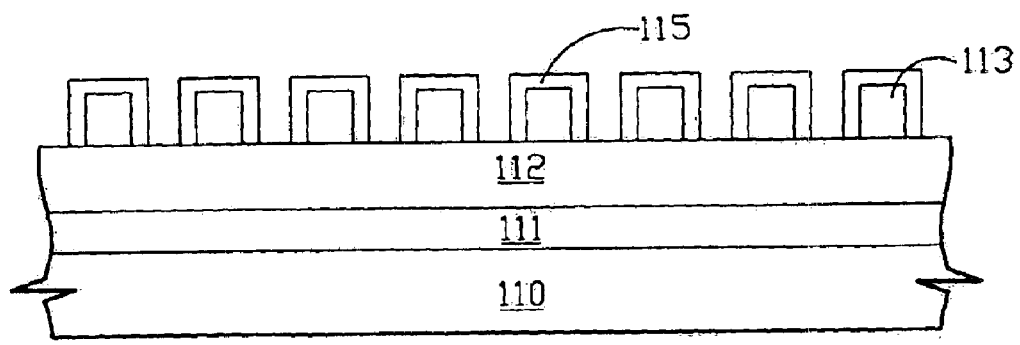
Figure 1E:
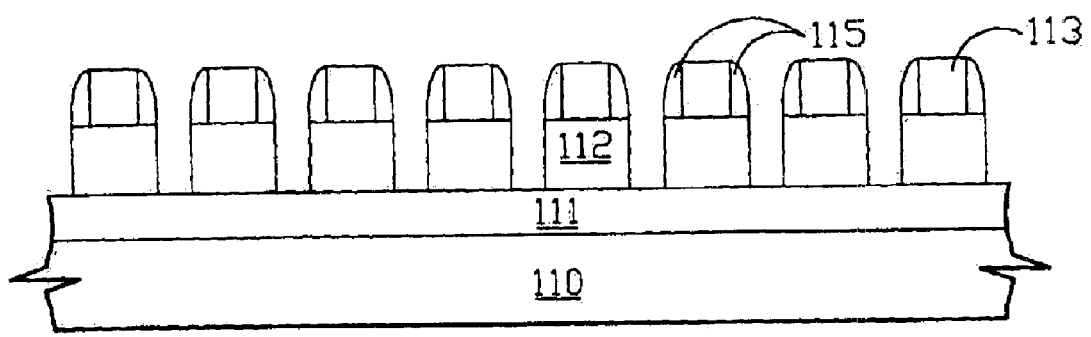
Figure 1F:
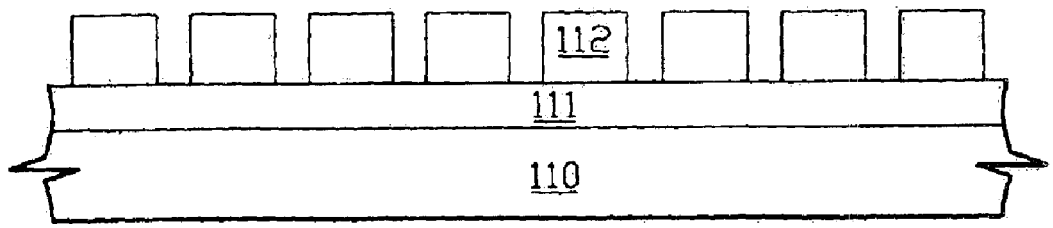
Figure 1G:
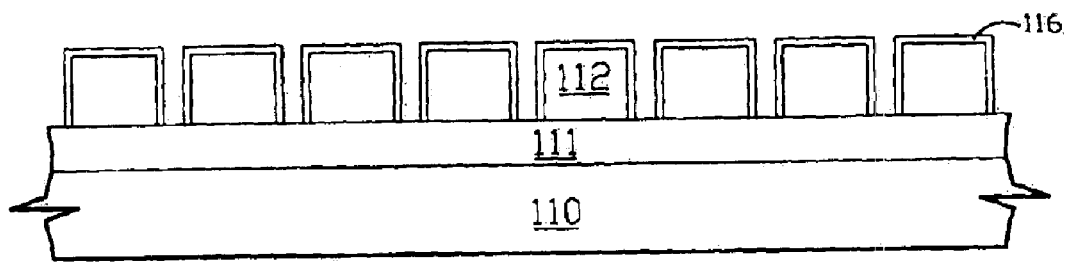
Figure 1H:
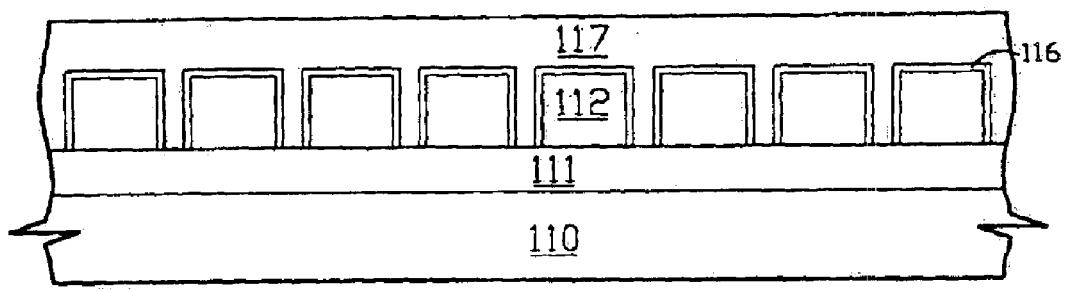
Figure 1I:
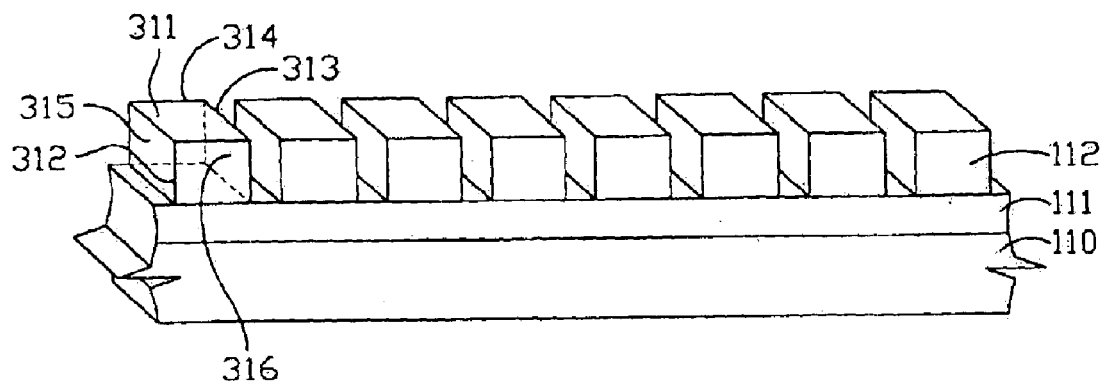
FIG. 1I is a three-dimensional illustration showing the floating gate surface area in the prior art.
Figure 2A:
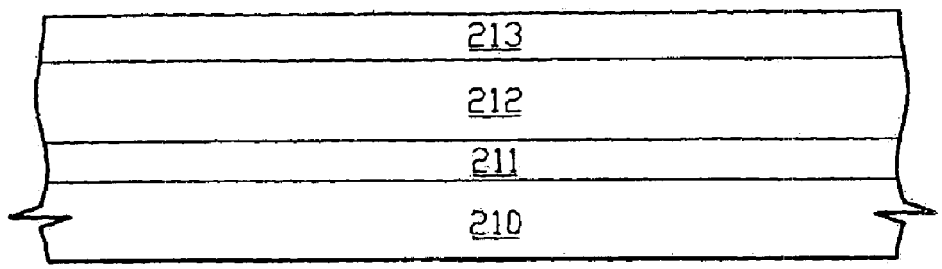
FIGS. 2A through 2I show the schematic cross-sectional views of the progression of steps for forming a flash memory device in the current invention.

FIGS. 2A through 2I are schematic cross-sectional views showing the progression of steps for forming a flash memory device according to a preferred embodiment of the current invention. As shown in FIG. 2A, a semiconductor substrate 210, typically a silicon substrate, is provided, and the semiconductor substrate has a plurality of shallow trench isolation (STI) structures (not shown) therein. A gate oxide layer 211 (sometimes called tunnel oxide), a first semiconductor layer 212, typically a polysilicon layer, and an insulating layer 213, typically a silicon nitride layer, are sequentially formed over the semiconductor substrate 210. The first semiconductor layer 212, used as floating gate material, is usually grown by chemical vapor deposition. The insulating layer 213, used as an etching mask for the first semiconductor layer etching, is usually grown by chemical vapor deposition.

Figure 2B:
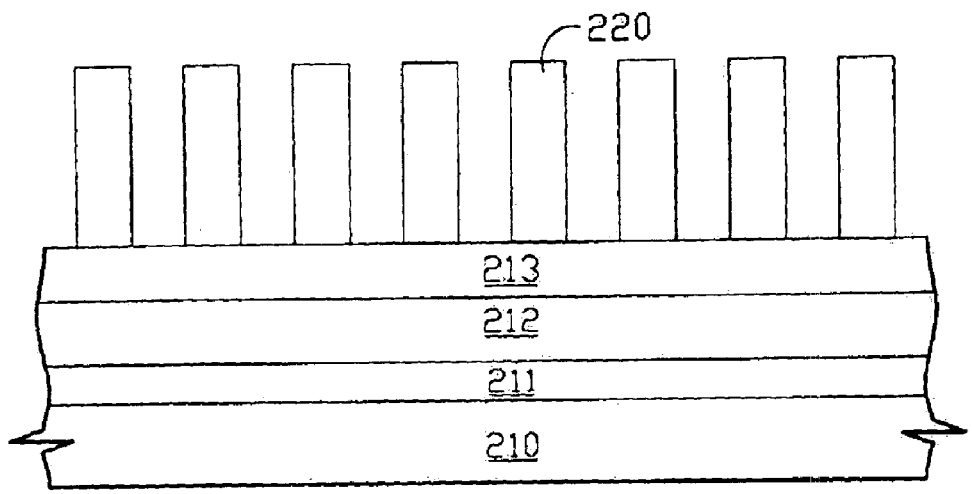

As shown in FIG. 2B, a photo resist layer 220 is then formed over the insulating layer 213 and patterned by a conventional photolithography process.

Figure 2C:
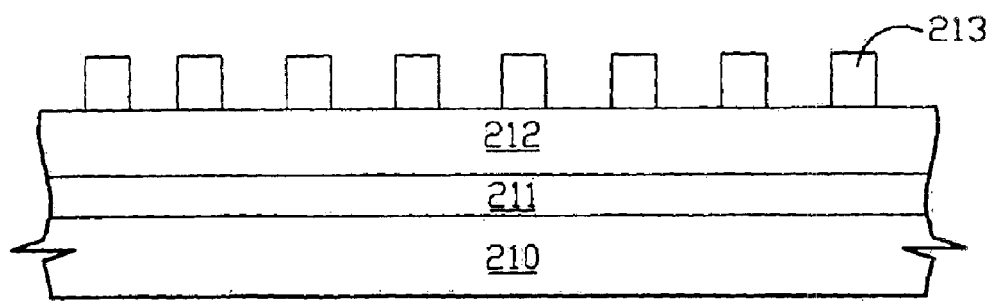

An etching process is then performed on the insulating layer 213. Next, the photo resist layer 220 is stripped after the etching reaction is completed, as shown in FIG. 2C.

Figure 2D:
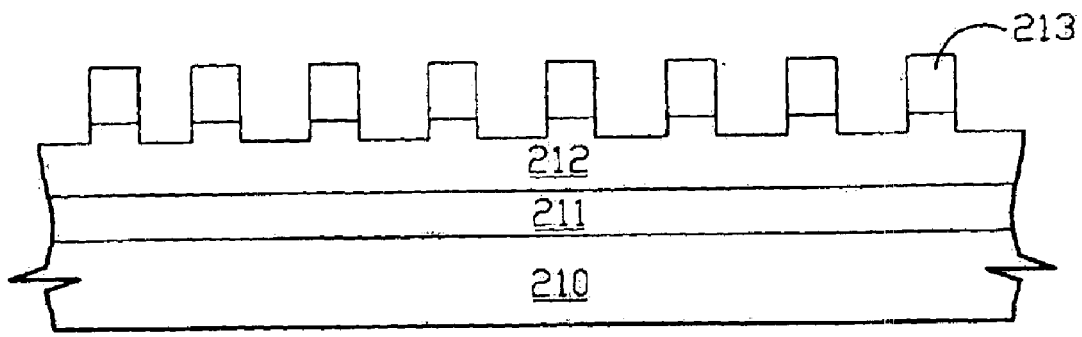
Figure 2E:
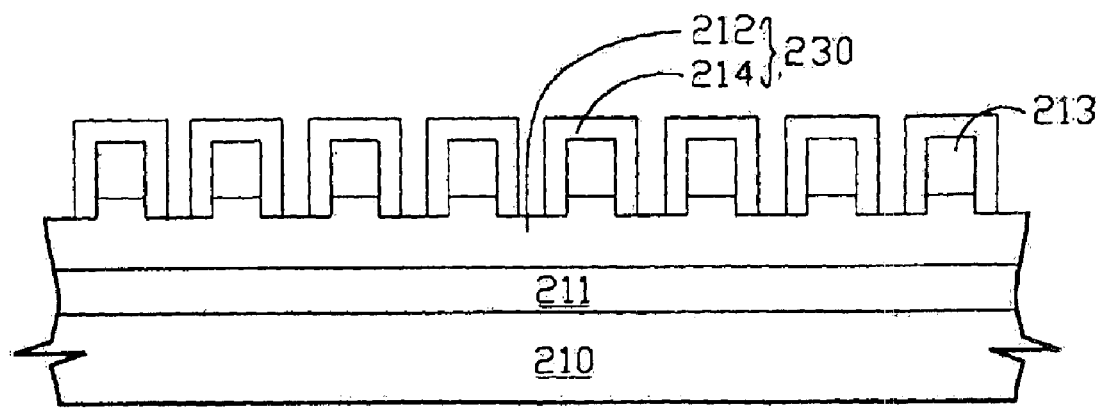

As shown in FIG. 2D, a partial etching action is then performed on the first semiconductor layer 212 by using the patterned insulating layer 213 as an etching mask. Next, in FIG. 2E, a semiconductor spacer 214, for example, a polysilicon spacer, is deposited onto the whole semiconductor substrate surface. Be one choice, the first semiconductor layer 212 is etched entirely until partial gate oxide layer 211 is exposed. Then a semiconductor spacer 214 is deposited over the exposed gate oxide layer 211, the first semiconductor layer 212, and the insulating layer 213. Another choice is to deposit a semiconductor spacer 214 directly over the exposed first semiconductor layer 212 and the insulating layer 213 without etching the first semiconductor layer 212. The semiconductor spacer 214 is used to increase the surface area of the floating gate overlapped with that of the control gate in order to increase the gate coupling ratio (GCR) of a flash memory device. The first semiconductor layer 212 and the semiconductor spacer 214 together form the new floating gate of the current invention and will be designated as layer 230 hereafter.

Figure 2F:
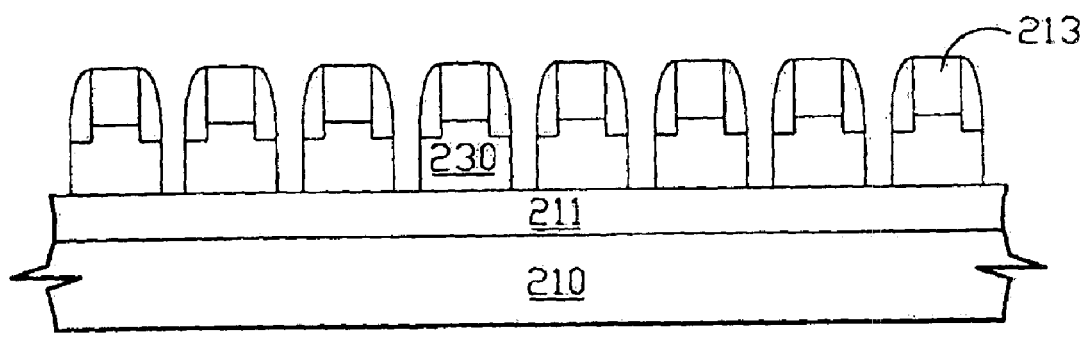
Figure 2G:
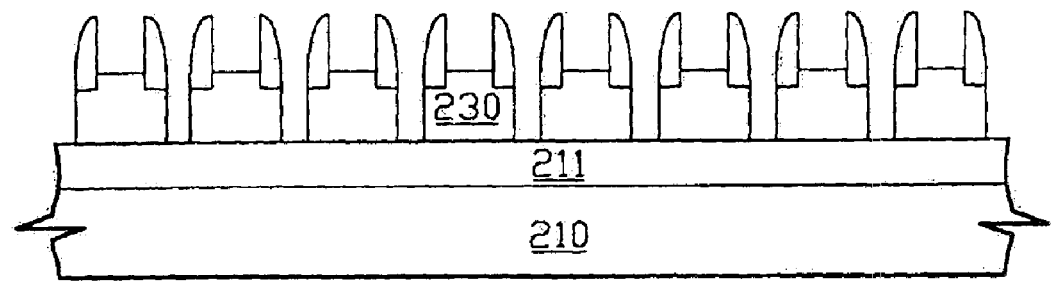

FIG. 2F shows that a further etching process is performed to etch away the top portion of the deposited semiconductor spacer 214 in order to expose the insulating layer 213 lying underneath it. In this etching process, the semiconductor spacer is used as a self-aligned etching mask; in other words, no additional photo masks and photolithography process are needed. Therefore a simpler manufacturing process and lower manufacturing cost are expected by using the method in the current invention. After the semiconductor spacer etching, the insulating layer is then removed by a conventional etching process, as shown in FIG. 2G.

Figure 2H:
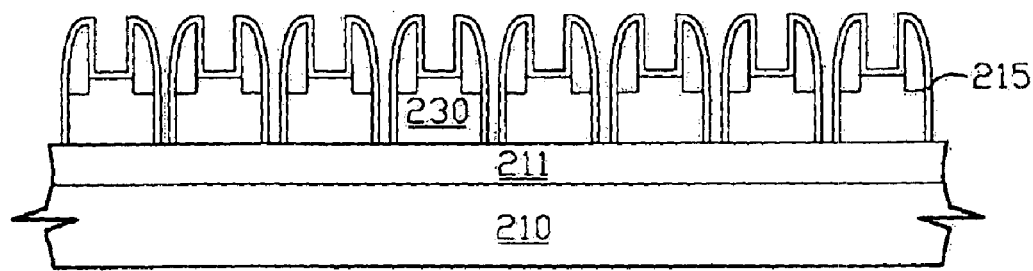

FIG. 2H then shows that an insulating stacked structure 215 is deposited by using, for example, chemical vapor deposition.

Figure 2I:
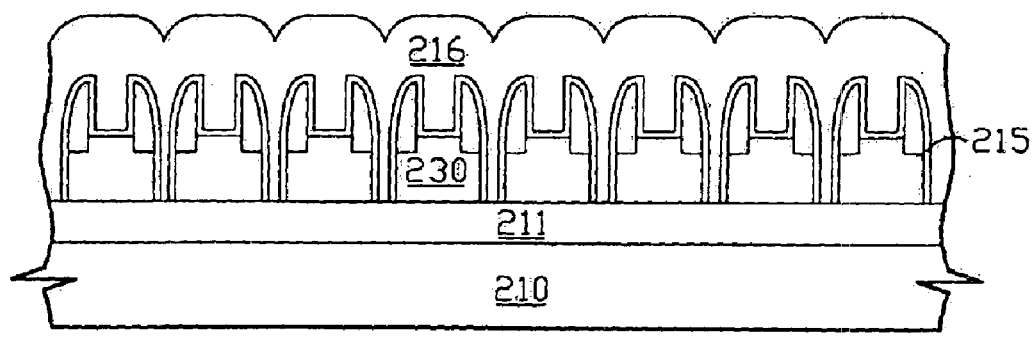

FIG. 2I shows that a second semiconductor layer 216 is then deposited. The second semiconductor layer forms the control gate of the device. After the second semiconductor layer etching, drain and source formation (not shown) are therefore accomplished by a conventional ion implantation process.

Figure 2J:
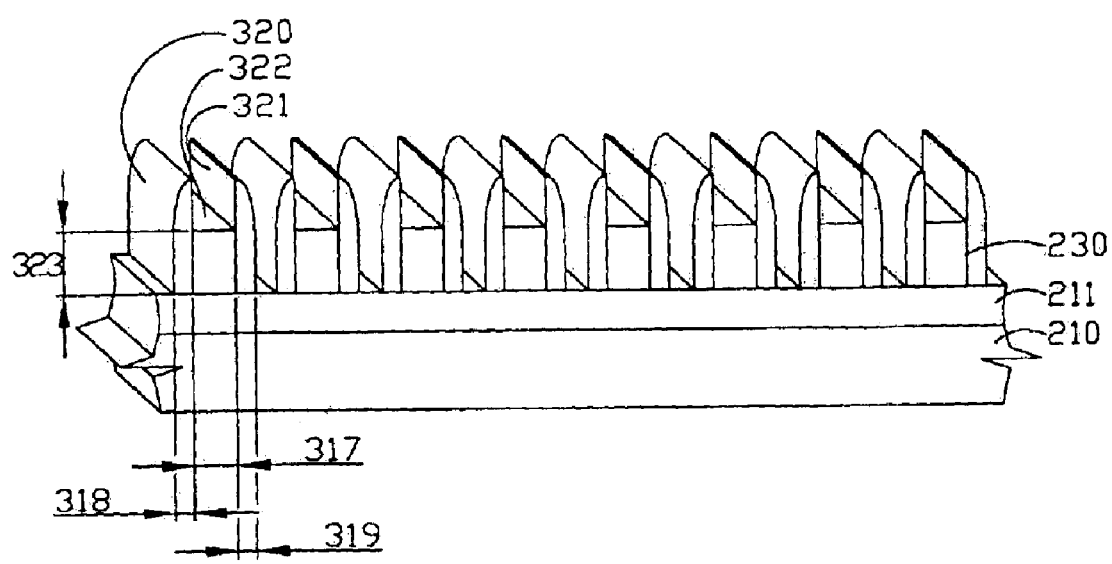
FIG. 2J is a three-dimensional illustration showing the floating gate surface area in the current invention.

FIG. 2J shows the new surface area of the floating gate in the current invention by a three-dimensional illustration. The new floating gate length is the sum of the length 317, which is typically 1500 A in the current invention, length 318, and length 319. Lengths 318 and 319 are the semiconductor spacer bottom lengths, typically 500 A each in the current invention. However, the total floating gate length, which is still 2500 A, is not increased in the current invention as compared to that in the prior art. This is very important because the same number of flash memory devices can be fabricated on an 8- or 12-inch silicon wafer. But the surface area that is effectively coupled to the control gate has been increased to more than twice that in the prior art. The reason will be explained as follows: the new surface area of the floating gate in the current invention is the sum of twice area 320, one of which is on the correspondingly opposite side of the area 320 hidden in this drawing, twice area 321, similarly, one of which is on the correspondingly opposite side of the area 321 hidden in this drawing, and one area of 322. The height 323 of the first semiconductor layer is typically 800 A and the semiconductor spacer height protruding above surface 322 is about 1500 A. The new floating gate width, which is still "Lw", is not changed from that in the prior art. Therefore, New floating gate surface area (for the current invention)=2× area320+2×area321+area322

According to this calculation, the new floating gate area that is effectively coupled to the control gate is as follows, New floating gate surface area (for the current invention)>9100$Lw$ It is now quite clear that the capacitance of the inter-poly layer (the insulating stacked structure) will be increased to more than twice the prior art value since the surface area of the floating gate effectively coupled to the control gate has been increased to more than twice the prior art value in the current invention. The GCR therefore is expected to be increased from 60% in the prior art to more than 75% in the current invention. Once the gate coupling ratio is enhanced, we can therefore expect a lower voltage to be applied on the control gate during device operation. A lower applied control gate voltage further results in less hazard of breakdown of the inter-poly dielectric (i.e., the insulating stacked structure) and hence a better device reliability is expected with the current invention.

Although specific embodiments have been illustrated and described, it will be obvious to those skilled in the art that various modifications may be made without departing from what is intended to be limited solely by the appended claims.

What is claimed is:

1. A method for manufacturing a flash memory device, said method comprising:

providing a semiconductor substrate;

forming a gate oxide layer on said semiconductor substrate;

forming a first semiconductor layer on said gate oxide layer;

forming an insulating layer on said first semiconductor layer;

removing partial said insulating layer until said partial first semiconductor layer is exposed;

forming a semiconductor spacer on both said insulating layer and said first semiconductor layer;

removing partial said semiconductor spacer until said insulating layer is exposed;

removing said insulating layer until said first semiconductor layer is exposed, wherein said semiconductor spacer protrudes through the top surface of said first semiconductor layer;

forming an insulating stacked structure on said first semiconductor layer and said semiconductor spacer; and forming a second semiconductor layer on said insulating stacked structure.

2. The method for manufacturing a flash memory device according to claim 1, further comprising removing partial said first semiconductor layer, wherein said insulating layer is used as an etching mask.

3. The method for manufacturing a flash memory device according to claim 2, further comprising forming said semiconductor spacer on the side wall of said first semiconductor layer.

4. The method for manufacturing a flash memory device according to claim 2, wherein removing partial said first semiconductor layer is conducted by an etching process.

5. The method for manufacturing a flash memory device according to claim 1, further comprising removing said first semiconductor layer to expose said gate oxide layer, wherein said insulating layer is used as an etching mask.

6. The method for manufacturing a flash memory device according to claim 5, further comprising forming said semiconductor spacer on said gate oxide layer.

7. The method for manufacturing a flash memory device according to claim 1, wherein said semiconductor substrate is of silicon material.

8. The method for manufacturing a flash memory device according to claim 1, wherein said semiconductor spacer is of polysilicon material.

9. The method for manufacturing a flash memory device according to claim 1, wherein said first semiconductor layer is of polysilicon material.

10. The method for manufacturing a flash memory device according to claim 1, wherein said second semiconductor layer is of polysilicon material.

11. The method for manufacturing a flash memory device according to claim 1, wherein said insulating layer is of silicon nitride material.

12. The method for manufacturing a flash memory device according to claim 1, wherein said first semiconductor layer and said semiconductor spacer together form a floating gate.

13. The method for manufacturing a flash memory device according to claim 1, wherein said second semiconductor layer forms a control gate.

14. The method for manufacturing a flash memory device according to claim 1, wherein said gate oxide layer is of silicon dioxide ($SiO_2$) material.

15. The method for manufacturing a flash memory device according to claim 1, wherein said insulating stacked structure is of oxide-nitride-oxide stacked structure.

16. The method for manufacturing a flash memory device according to claim 1, wherein said semiconductor spacer can be used as an etching mask in a self-aligned etching process.

17. The method for manufacturing a flash memory device according to claim 1, wherein said steps of removing partial said insulating layer comprises:

forming a photo resist layer on said insulating layer;

patterning said photo resist layer; and using said patterned photo resist layer to etch away partial said insulating layer.

* * * * *